United States Patent [19]

Harris et al.

[11] 4,021,654

[45] May 3, 1977

[54] DIGITAL FILTER

[75] Inventors: Harvey H. Harris, Clearwater; Victor Lindberg, Largo; Dale M. Walsh, Clearwater, all of Fla.

[73] Assignee: Paradyne, Inc., Largo, Liechtenstein

[22] Filed: June 11, 1975

[21] Appl. No.: 586,020

[52] U.S. Cl. .............................. 364/724; 307/279; 328/167
[51] Int. Cl.² .................... G06F 7/38; G06F 15/34
[58] Field of Search ........... 235/156, 152; 328/167; 307/213, 279, 303; 325/42, 65; 333/18, 28, 70 T

[56] References Cited

UNITED STATES PATENTS

| 3,609,568 | 9/1971 | Jackson | 328/167 |
| 3,639,848 | 2/1972 | Elliott | 328/167 |
| 3,714,402 | 1/1973 | Baumwolspiner | 235/152 |
| 3,737,900 | 6/1973 | Vehrs, Jr. | 235/156 N X |
| 3,838,348 | 9/1974 | Pezzutti | 328/167 |

*Primary Examiner*—Joseph F. Ruggiero
*Attorney, Agent, or Firm*—Stefan M. Stein; Robert F. Frijouf

[57] ABSTRACT

A MOS/LSI digital filter comprising multiplier circuitry with more than one serial multiplier section, accumulator circuitry with overflow correction and true sign logic, and coefficient circuitry is contained in special MOS/LSI devices.

5 Claims, 9 Drawing Figures

DIGITAL FILTER

BACKGROUND OF THE INVENTION

1. Field of the Invention

A filter is a signal processing device which is capable of discriminating in favor of or against certain classes of signals, generally as a function of frequency. The digital filter operates upon a digitized signal, performing calculations upon the signal and outputting the result as a modified or filtered version of the input.

2. Description of the Prior Art

There are essentially three classifications of filters. The first two classifications are filters which deal with analog signals, that is, signals which are continuous in time. The third class of filters deals with digital signals, that is, signals which have discrete values for a certain element of time. The first class of filters is the passive filter composed of inductors, capacitors, and resistors. The second class of filter is active filter composed of resistors, capacitors, and amplifiers. Both of these are well known and understood. The third class of filter is the digital filter. The theory of digital filters is known but until recently the expense of constructing these filters has been prohibitive. Recent advances in MOS/LSI technology now makes digital filters economically feasible in certain applications.

There are various means of implementing digital filters, the problem being dominated by trade-offs in flexibility, economy, physical size and complication of various design schemes, and internal logic problems. Various approaches are shown in the literature, "Approach to the Implementation of Digital Filters"Jackson Kaiser, McDonald, IEEE trans. audio electroacust., volume AU-16, pp 413–421, Sept. 1968; "Designers Guide to: Digital Filters," Leon and Bass, Electronic Design News, Jan. 20, 1974.

Contemporaneous prior art for digital filters typically uses a building block approach. Each multiplication is accomplished by an individual multiplier chip, thus requiring several such chips. Delays are achieved by individual delay chips. Input/output is handled by 1 chip. Timing pulses are generated on individual packages, one for each phase. Power buffer is on 1 chip. An ROM is necessary for the desired coefficients.

Typically, for a recursive second-order serial digital filter the following packages or chips are necessary:

2 shift register delay chips
4 multiplier chips
1 input/output chip
1 power buffer chip
1 ROM chip This is a total of 9 packages which must be operatively connected to form the desired filter. Usually after the "building block" approach has been tested and evaluated, the special filter developed is produced on custom MOS chips. This method leaves little or no flexibility in the filter developed and requires a substantial amount of interconnection between the numerous chips.

Thus, a need exists for a digital filter construction of a minimum number of MOS/LSI chips to minimize expense of development and production, which has the flexibility to vary filter characteristics without an entire alteration of the filter, and which can be adapted to a wide range of uses.

SUMMARY OF THE INVENTION

The digital filter as described herein is a numerical, sample data process that reshapes the frequency spectrum of an input signal. The theory underlying digital filters is well known and described in literature above mentioned. For the purpose of the subject filter, the cascade form with second order factors with real coefficient has been chosen. This form of filter is described by its z-domain transfer function of the form:

$$H(Z) = \prod_{i=1}^{m} \frac{a_{oi}\alpha_{2i}Z^{-2} + a_{oi}\alpha_{1i}Z^{-1} + a_{oi}}{\beta_{2i}Z^{-2} + \beta_{1i}Z^{-1} + 1}. \quad \text{Equ. 1}$$

In this form the filter uses cascade second order sections. Each section represents one term in the product series, each having two poles and two zeros. The coefficients $\alpha_{2i}$, $\alpha_{1i}$, $\beta_{2i}$ and $\beta_{1i}$ determines the pole and zero locations. The term $A_{oi}$ is a throughput gain coefficient.

The coefficients determine the characteristics of the filter, whether low pass, high pass, band pass, band stop or all pass phase equalizer. Multipliers $\alpha_{2i}$ and $\alpha_{1i}$ locate the biquad zeros. $\alpha_{2i}$ adjusts the depth of the notch and $\alpha_{7i}$ determines the frequency location. Note that as $\alpha_{2i}$ approaches one, the notch becomes a frequency zero. Coefficients $\beta_{2i}$ and $\beta_{1i}$ are feed backterms and determine pole locations. $\beta_{2i}$ determines the damping factor and $\beta_{1i}$ largely determines the natural frequency.

Ideally, the configuration of the subject digital filter is a three chip functional layout. One chip contains multiplier chains, another chip contains accumulator and logic functions, and a third chip contains coefficient storage and internal counters for timing. Of particular importance herein are the multiplier chip and accumulator chip. The chip containing coefficient storage and timing is characteristically a read only memory (ROM). However, any source of coefficient generation or storage and timing for access of these coefficients to the multiplier and accumulator chips would be suitable. Accordingly, it is not an absolute requirement of the present invention that specifically three chips be utilized in the functional layout of the configuration of the subject digital filter.

The accumulator storage chip is a high speed MOS chip operating with a maximum clock frequency of approximately 2 MHz. This chip's function is to perform the summations required for the filter structure; provide dynamic storage for the delayed data and provide elastic buffering for the structure output data. The accumulator chip means comprises serial adder means, twos compliment means, delay means, true sign logic means, overflow correction means, and scaler means.

The multiplier chip is a high speed dynamic type MOS chip operating with a two phase clock at a maximum frequency of 2 MHz. The multiplier chip means comprises more than one serial multiplier means and timing means whereby said serial multiplier means are controlled.

An add on device, the oscillator/modulator, allows broadening of the capability of the digital filter. In certain applications it is necessary to modulate the sampled data stream. Since all the input to the digital filter is in numbers, a source of a numerical sine wave is needed to multiply the data stream in order to generate a modulated data stream. Typically, this is the input to the digital filter and treated as any other sampled data. The OSC/MOD is also necessary for phase lock loop (PLL) configurations of the filter. A key feature of the OSC/MOD is that the frequency of the digital sine wave generated does not have to have a harmonic or sub-harmonic relation to the sampled frequency. The OSC/MOD chip comprises summation means, multiplier means, delay means, twos compliment means, overflow control means, sign control means, and storage means.

The digital filter means operates in the following manner. At least one analog or digital data stream is sampled, and if analog, digitalized, by means known in the industry. Data is sampled at a clock rate of typically 9.6 Hz. The internal clock of the digital filter operates typically at a rate between 1.5–2.0 MHz.

The digitalized datum is input to the accumulator chip means. Input may be asynchronous buffered, TTL, gated, or ungated synchronous. There is input gating means which accepts the appropriate constant from the ROM and accepts either input data or permits another cycle through the filter. The digital filter means handles data in the two's compliment binary representation, as will be further explained. The output of the input gating means is tested for sign and fed to first summation means. The signal is then tested for sign and sent to scaler means and to first delay means. From first delay means said signal is sent three ways, to second delay means, to first multiplier means on multiplier chip means where it is multiplied by an appropriate constant from the ROM to third multiplier means on multiplier chip means where it is multiplied by a constant from the ROM. The output from first multiplier means passes to fourth summation means. The output from third multiplier means passes to third summation means. The output from second delay means is sent to the input of second multiplier means and to the input of fourth multiplier means where the input is multiplied by constants from the ROM, both on multiplier chip means. The output from second multiplier means passes to fourth summation means, and the output from fourth multiplier means passes to third summation means. The output of fourth summation means, the sum of the products from first and second multiplier means, passes to one input of first summation means where it is summed with a term from the previous biquad computation cycle as feedback to begin the cycle again. The output from third summation means, the sum of the products from third and fourth multiplier means, passes to one input of second summation means. The output of second summation means, the sum of the output of third summation means, is gated to either the output of the digital filter or back into input gating means to recycle through the digital filter with a new set of constants from the ROM. The number of cycles and word synchronization is controlled by the ROM.

It can be seen that the algorithm is attained. The present configuration allows for 13 cycles through the filter, this is thirteen product terms in equation 1. First delay means corresponds to $Z^{-1}$, and first and second delay means correspond to $Z^{-2}$. Third multiplier means multiplies the $\alpha_{2i}$ coefficients from ROM by $Z^{-2}$. Likewise, first multiplier means multiplies the $\beta_{1i}$ coefficients from ROM by $Z^{-1}$ and second multiplier means multiplies the $\beta_{2i}$ coefficients from ROM by $Z^{-2}$. The denominator terms are summed in fourth summation means and fed back into first summation means. The numerator terms are summed in third summation means and input to second summation means.

The sign is detected on all the inputs to the accumulator chip means, and the true sign is calculated throughout the entire cycle through the filter. At the output of digital filter means, the true sign is inserted into the result and passed on. It is necessary to keep track of the true sign through-out the entire process within the digital filter in order to overcome significant problems which develop when overflow occurs in the twos compliment representation. Overflow in the twos compliment binary representation constitutes a flip in sign at points of maximum amplitude. Thus, an uncompensated overflow constitutes a catastrophic breakdown and possibly can cause feedback oscillation within the filter. True sign calculations allows for controlled overflow in the twos compliment representation. Rather than the catastrophic overflow which destroys the data in calculation, the overflow is controlled. This can be thought of as an over driving of an electrical component rather than the catastrophic oscillation.

BRIEF DESCRIPTION OF THE DRAWINGS

For a fuller understanding of the nature and objects of the invention, reference should be had to the following detailed description taken in connection with the accompanying drawings in which.

Similar reference characters refer to similar parts throughout the several views of the drawings.

DETAILED DESCRIPTION

Figure 1:
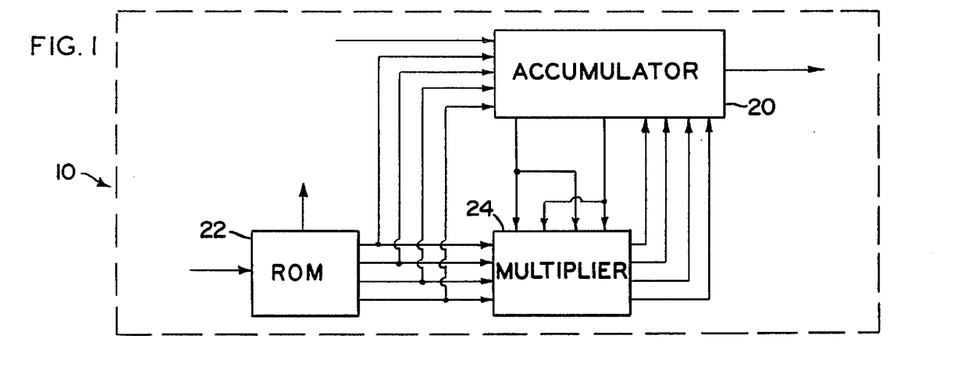
FIG. 1 is a block diagram of a digital filter device.

FIG. 1 is a block diagram of digital filter means 10. The signal to be filtered, in a digitalized form, passes to the input of accumulator means 20. As the input data is processed through accumulator means 20, appropriate filter constants are sent up from ROM means 22. When a multiplication is necessary for the algorithm, the numbers to be multiplied are clocked from accumulator means 20 to multiplier chip means 24. Multiplier chip means 24 comprises a plurality of serial multiplier means. Any constants necessary for the multiplication are clocked to multiplier chip means 24 from ROM means 22. The product generated in multiplier chip menas 24 passes from the output back to accumulator means 20 where the result is used to complete the algorithm. The signal, as modified by digital filter means 10, passes from the output of accumulator means 20.

Figure 2:
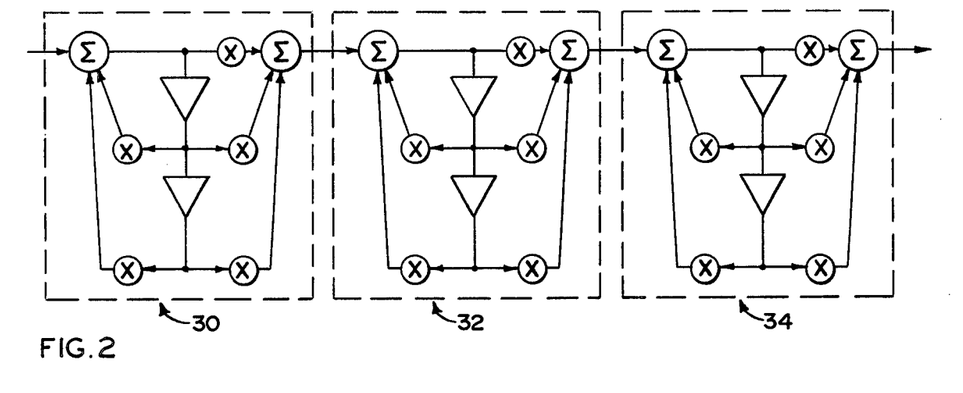
FIG. 2 is a block diagram of a six pole filter computation sequence using cascaded second order sections.

FIG. 2 is a logic block diagram showing cascading biquad sections, reflecting the algorithm used to effectuate equation one. Each biquad solves a second order equation, i.e. one term in the summation of equation one. The digitilized sample passes to the input of biquad section means 30, is operated upon and the result is passed to the input of biquad section means 32. The output from biquad section means 32 passes to the input of biquad section means 34. In the present embodiment there is the capability of using thirteen biquad section means. For each biquad section means there are coefficients for the multiplier means and scaler means. This is the algorithmic layout of the digital filter means 10. However, the embodiment of said filter means is accomplished by multiple passes through one biquad section, as will be detailed hereinafter.

Figure 3:
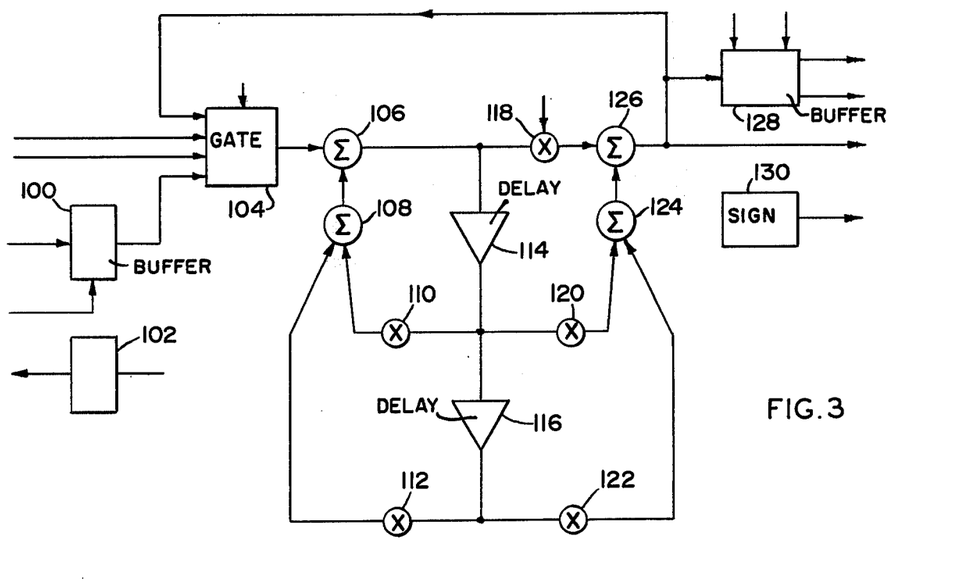
FIG. 3 is a block diagram of the basic logic of a digital filter device.

FIG. 3 is a block diagram of the basic logic of digital filter means 10. There are several methods of inputing sampled data. For the present embodiment the input data must be in two's compliment representation. Asynchronous buffered input (A in − 0) and clock signal (ACKLIN), customer provided, are buffered into buffer means 100. The signal then passes to input gating means 104. There is buffered, gated synchronous input (B in −1) which is gated by the B-gate out signal into input gating means 104. This is primarily for TTL input signals. The M in − 0 input is unbuffered synchronous input to input gating means 104. The customer must conform his data to pre-set filter requirements for this input. Signals from ROM means 22 control the gating of input gating means 104. The input to gating means 104 is enabled for sequential biquad computations. The output from input gating means 104 passes into first summation means 106. Output from summation means 106 is fed to first delay means 114 and to scaler means 118. First delay means 114 comprises a 156 bit delay. Scaler means 118 applies a multiplicative constant of 1, ½, ¼ or 0 from ROM means 22. Output of scaler means 118 passes to one input of second summation means 126. The output of first delay means 114 is sent to three different functions. One is first multiplier means 110 on multiplier chip means 24 which multiplies the output of first delay means 114 by specified constants from ROM means 22. Output from first multiplier means 110 passes from multiplier chip means 24 to fourth summation means 108. The output of first delay means 114 secondly passes to third multiplier means 120 on multiplier chip means 24. The output of first delay means 114 is multiplied by constants supplied from ROM means 22 and then passes from multiplier chip means 24 to third summation means 124. Thirdly, the output from first delay means 114 passes to the input of second delay means 116. Second delay means 116 comprises a 195 bit delay. The output of second delay means 116 passes to second multiplier means 112 on multiplier chip means 24. The output of second delay means 116 is multiplied by constants supplied by ROM means 22 and the output of second multiplier means 112 passes from multiplier chip means 24 to fourth summation means 108 on accumlator chip means 20. The output from second delay means 116 also passes to fourth multiplier means 122 on multiplier chip means 24. The output of second delay means 116 is multiplied by appropriate constants supplied by ROM means 22. The output of fourth multiplier means 122 passes from multiplier means chip 24 to third summation means 124 on accumulator chip means 20. The output from third summation means 124, the summation of the product from third multiplier means 120 and the product from fourth multiplier means 122 passes to second summation means 126. The output of fourth summation means 108, the sum of the products from first multiplier means 110 and from second multiplier means 112 passes to first summation means 106. It is thus seen that terms passing from fourth summation means 108 to first summation means 106 are feedback terms which are input to the filter calculation again.

Output from second summation means 126 is either output from digital filter means 10 or fed back to input gating means 104, dependent upon the number of biquads in the computation cycle. If the output from second summation means 126 is fed to input gating means 104, a new set of coefficients are presented from ROM means 22 and the output of input gating means 104 is fed to first summation means 106. At this point the process begins again. Output from second summation means 126 can be gated buffered through buffer means 128 on signals from ROM means 22. Also output from digital filter means 10 is the true sign from overflow correction means 130.

It should be understood that any of the summation means 106, 108, 124 and 126 may be considered the first, second, third or fourth summation means, similarly, any of the multiplier means 110, 112, 120 and 122 may be considered the first, second, third or fourth multiplier means.

Figure 4:
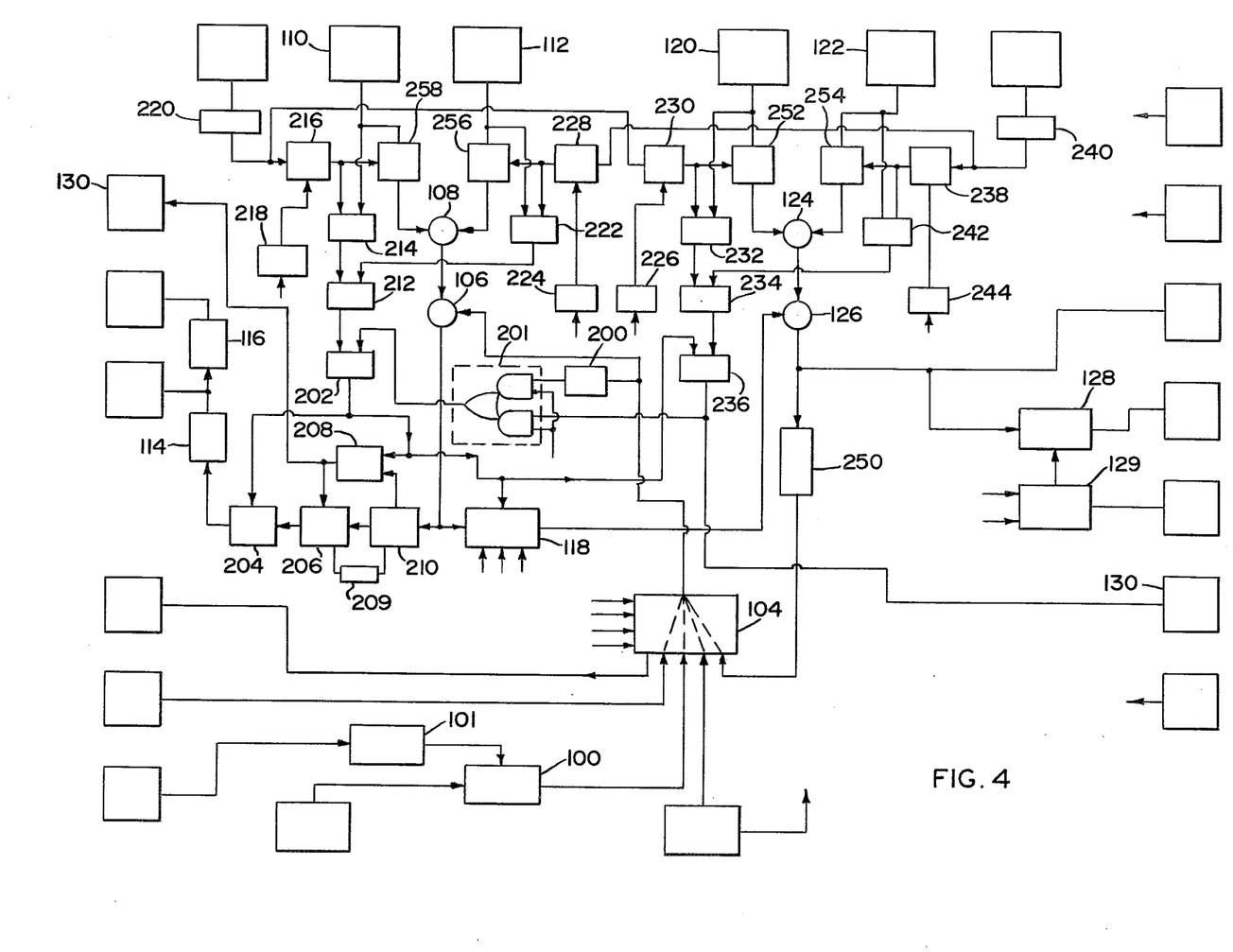
FIG. 4 is a detailed schematic of the accumulator logic and true sign tree.

FIG. 4 is a block diagram of the logic of the accumulator including the sign detection and true sign tree logic. This is a detailed logic schematic of accumulator chip means 20. It contains most of the elements shown in FIG. 3 and the true sign tree. Input gating means 104 may receive customer provided clock input after it has been synchronized by clock synchronizer means 101 and buffered through an input buffer means 100 with the digitalized sample data, TTL gated input data (B in −0), or synchronous data (Min−1). Gate control signals from ROM means 22, and multiple cycle summations from second summation means 126 are also input to input gating means 104. The output of input gating means 104 passes to first summation means 106. It is also tested for sign by sign detect means 200, the output of sign detect means 200 passes to stream gate means 201, the output of stream gate means 201 passes to true sign detector mean 202. True sign detect means 202 receives the sign input from true sign detect means 212, first summation means 106, and stream gate means 201. The true sign is calculated by true sign detector 202 and passes then to sign insertion means 204 and to overflow detector means 208, scaler means 118 and true sign detector means 236. Sign insertion means 204 received the true sign from true sign detector 202 and overlfow correction from overflow correction means 206. The signal passes from the output of sign insertion means 204 into first delay means 114. The output of first delay means 114 is converted to sign-magnitude representation and passes to multiplier chip means 24 and to multiplier means 110 and 112 thereon. The output of first delay means 114 also passes to second delay means 116. The output of second delay means 116 is converted to sign-magnitude representation and passes to multiplier chip means 24 and to third and fourth multiplier means 120 and 122 respectively located thereon. The output from first multiplier means 110 passes to accumulator chip means 20. The true sign is determined by true sign detector means 214 and it is converted to twos compliment binary notation by twos complimenter means 258. It then passes to fourth summation means 108. The sign from first delay means 114 is calculated by sign detector means 220. The sign of the coefficient multiplier from ROM means 22 is detected by sign detect means 218. The sign of the product coming in from first multiplier means 110 is then calculated by sign calculator means 216. The output of this passes to true sign detector 214. The true sign is then determined, indicating whether there is an overflow in first multiplier means 110. The true sign is output from true sign detector 214 and fed to true sign detector 212. Also input to true sign detector means 212 is the sign calculated from fourth summation means 108 and the sign caluclated as the true sign from second multiplier means 112. True sign detector means 212 output passes to the input of true sign detector means 202. Also input to true sign detector means 202 is the sign of first summation means 106 and the sign of the output from stream gate means 201.

True sign detector means 222 determines the true sign of the product from second multiplier means 112. Input to true sign detector means 222 is the sign from second multiplier means 112 and the true sign as determined by true sign calculator means 228. Input to true sign calculator means 228 is the sign of the coefficient from ROM means 22 and the sign from second delay means 116 is detected by sign detect means 240. The output of second multiplier means 112 passes to twos complimenter means 256 which then, in the binary representation, passes to fourth summation means 108 where it is summed with the input from first multiplier means 110 and the output passes to first summation means 106.

The true sign of the output of third multiplier means 120 is determined by applying to sign calculator means 230 the sign of the output of first delay means 114 and the sign of the coefficient from ROM means 22 as determined by sign detect means 226. The sign is then output from sign calculator means 230 to true sign detector means 232 and to twos ccomplimentor means 252. Also input to twos complimentor means 252 is the input from third multiplier means 120. The output of twos complimentor means 252 passes to third summation means 124.

The output from fourth multiplier means 122 passes to true sign detector means 242 and to twos complimenter means 254. The true sign of the output of fourth multiplier means 122 is determined by taking the output from second delay means 116, detecting the sign by sign detect means 240 and inputting that into sign calculation means 238. Also in the sign caluclator means 238 is the sign from the coefficient from ROM means 22 as determined by sign detector means 244. This is input into sign caluclator means 238. Output from sign calculator means 238 passes to twos complimenter means 254 and to true sign detector means 242. The true sign as determined by true sign detector means 242 passes to true sign detector 234. Also applied to true sign detector 234 is the true sign output determined by true sign detector means 232 and the sign from third summation means 124. True sign detector means 234 detects a sign and outputs it to true sign detector means 236. Also applied to true sign detector means 236 is the sign from second summation means 126 and the sign from true sign detector means 202. Output from true sign detector 236 passes to stream gate means 201 and to true sign output means 130.

The effect of the true sign tree is that when there is an overflow in twos compliment binary representations, catastrophic sign flip does not occur. Rather, the true sign is calculated, maintained and inserted into the result. Thus, the output, while perhaps overflowed, is usable, whereas, if a true sign were not calculated, the output would become meaningless and perhaps cause feedback oscillation within the filter.

It is to be noted that the input to accumulator chip means 20 is in twos compliment representation. The output from accumulator chip means and from the digital filter is in the twos compliment representation. There is conversion to sign magnitude representation (S/M) by sign magnitude convertor means 209 for input to first and second delay means 114 and 116, respectively, and all representation on multiplier chip means 24.

In the above description of the true sign tree the following devices were named: Sign calculator means 216, 228, 230 and 238; Sign detect means 200, 218, 220, 226, 240, 242 and 244; Multiplier true sign calculator means 214, 222, 232 and 242; and Summation true sign calculator means 202, 212, 234 and 236. These are further described as follows:

Sign calculator means comprises a Mod 2 adder for the sign bit of the input word.

Figure 5:
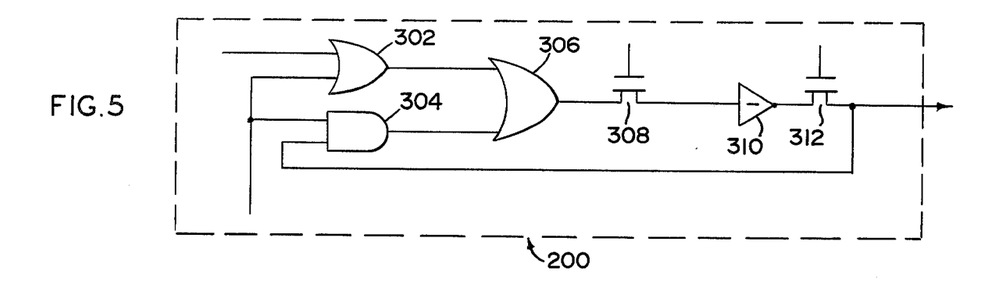
FIG. 5 is a block diagram of sign detect means.

Sign detect means 200 (also representative of sign detect means 218, 220, 224, 226, 240 and 244) (FIG. 5) comprises NOR gate means 302 and 306 respectively and a NAND gate means 304. These are operatively connected such that the word whose sign is to be detected is input to NOR gate means 302, a clock pulse for word synchronization is input to both NOR gate means 302 and NAND gate means 304, and input to NAND gate means 304 is the output from gate means 312. Output from NOR gate means 302 and from NAND gate means 304 are input to NOR gate means 306. The output of NOR gate means 306 is gated through gate means 308, inverted by inverter means 310 and gated through gate means 312.

Figure 6:
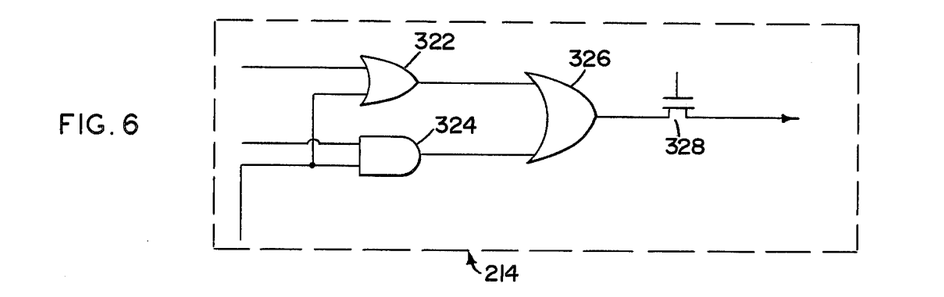
FIG. 6 is a block diagram of multiplier true sign calculator means.

Multiplier true sign calculator means 214 (also representative of sign detect means 222, 232 and 242) as shown in FIG. 6 comprises NOR gate means 322 and 326, NAND gate means 324 and gate means 328. Input to NOR gate means 322 is from a twos complimenter means and from a serial multiplier and from a sign calculator means. The output of NOR gate means 322 and of NAND gate means 324 are input to NOR gate means 326. The output of NOR gate means 326 is clocked by gate means 328 to a summation true sign calculator means, to be decribed hereinafter. Effectively, multiplier true sign calculator means treat the input sign from twos complimenter means as the valid sign. If a sign from the serial multiplier means or from the sign calculator means differs from the valid sign, an overflow in the multiplier is indicated.

Figure 7:
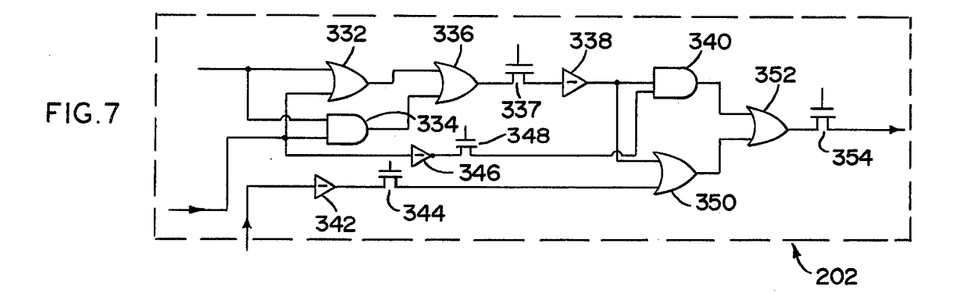
FIG. 7 is a block diagram of summation true sign calculator means.

Summation true sign calculator means 212 (also 234) as shown in FIG. 7, comprises NOR gate means 332, 336, 350 and 352, NAND gate means 334 and 340, gate means 337, 344, 348 and 354, and inverter means 338, 342 and 346. Input to NOR gate means 332 and NAND gate means 334 is from a first multiplier true sign calculator means and from a second multiplier true sign calculator means. Output from NOR gate means 332 and from NAND gate means 334 are input to NOR gate means 336. The output from NOR gate means 336 is gated by gate means 337, inverted by inverter means 338 and input to NAND gate means 340 and NOR gate means 350. The second input to NAND gate means 340 is from second multiplier true sign calculator means after being inverted by inverter means 346 and gated by gate means 348. The second input to NOR gate means 350 is from a summation means after being inverted by inverter means 342 and gated by gate means 344. The output of NAND gate means 340 and NOR gate means 350 are input to NOR gate means 352. The output of NOR gate means 352 is gated by gate means 354 to either summation true sign calculator means 202 or 236.

Summation true sign calculator means 202 and 236 are identical to FIG. 7. The input to NOR gate means 332, NAND gate means 334 and NAND gate means 340 is from stream gate means 201 for summation true sign calculator means 202. For summation true sign calculator means 236 the input to NOR gate means 332 and NAND gate means 334 is from the output of summation true sign calculator means 202.

The oscillator modulator (OSC/MOD) is a self contained MOS/LSI chip which generates a digital sine wave. The heart of the OSC/MOd is a robust digital oscillator means 400 shown in FIG. 8. The base frequency $f$ is a constant selected and input to multiplier means 410 where it is multiplied by the output of delay means 406. The output of multiplier means 410 passes to summation means 404. Multiplier means 412 multiplies the output of delay means 406 by a small frequency shift, $\Delta f$, and outputs the product to summation means 404. The output of delay means 406 also passes to delay means 408. The output of delay means 408 passes to substraction means 402, division means 414 and most significant bit (MSB) sense means 416. In subtractor means 402 1 is subtracted from the output of delay means 408 and the output of subtractor means 402 is input to summation means 404. The output of delay means 408 also passes to division means 414 where the output is divided either by 512 or by 32. Output of delay means 408 also passes to MSB sense means 416. MSB sense means 416 looks to the most significant bit of the output of delay means 408 and determines whether that is above a preset number. If the output of delay means 408 is above a preset number as determined by MSB sense means 416, sign selector means 418 inserts the appropriate sign in the output of division means 414 and the output of sign selector means 418 is input to summation means 404. Summation means 404 outputs the digital sign wave and feeds it back into the robust digital oscillator.

Figure 8:
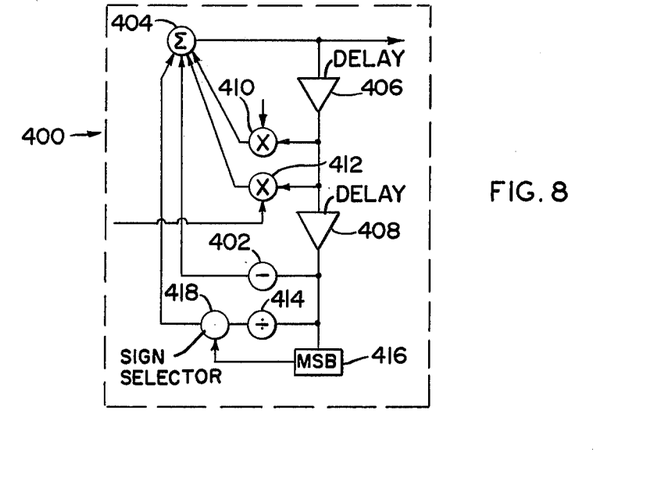
FIG. 8 is a block diagram of the basic logic of the robust digital oscillator.

Robust digital oscillator means 400 is a self-sustaining oscillator. The frequency is selected and input into multiplier means 410 and small shifts in frequency may be selected and input to multiplier means 412. As the oscillator rings up or down, sign select means 418 inserts the appropriate sign as determined by MSB sense means 416 in order to keep the robust digital oscillator means 400 operating at a predetermined amplitude. The rate of ringing up or ringing down of the oscillations is determined by division means 414. The effect of subtractor means 402 and sign calculator means 418 in conjunction with division means 414 is to have one minus one over 512 or one plus one over 512, or one minus one over 32 or one plus one over 32. This changes the stability of the oscillator from stable to unstable, and also determines the size of the instabiltiy or stability.

Figure 9:
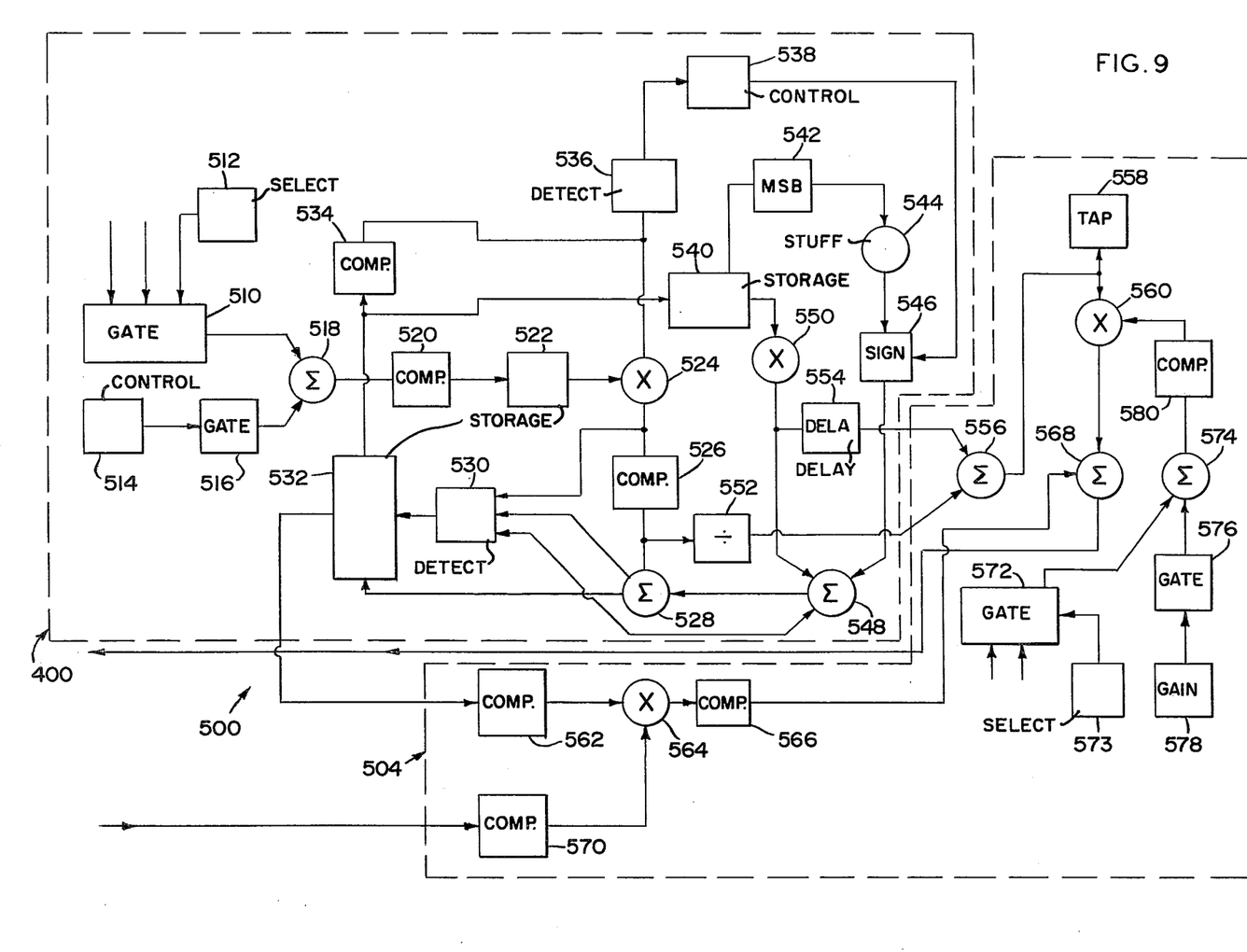
FIG. 9 is a detailed logic diagram of the oscillator modulator.

FIG. 9 shows the logic diagram of the oscillator modulator chip means 500 which comprises robust digital oscillator means 400 and modulator means 504. Oscillator constant and gating control via means 510 accepts, upon command from word select means 512 a constant from ROM means 22. The present embodiment permits access of one of two constants from ROM means 22, however, any number of constants is permissible. The constants selected from ROM means 22 will determine the frequency output of robust digital oscillator means 400. Output of oscillator constant gating and control means 510 is input to summation means 518. Also input to summation means 518 is the output of voltage control means 514 gated to summation means 518 by gating means 516. Voltage control means 514 provides a method of feedback control to shift phase or the frequency by a small amount. Output of summation means 518 is twos complimented by twos complimenter means 520 and stored in storage means 522. The word storage in storage means 522 is clocked to serial multiplier means 524. The other number input to serial multiplier means 524 is a feedback term which will be detailed hereinafter. The output of serial multiplier 524 passes to overflow detector means 530 and to ones complimenter means 526. Ones complimenter means 526 merely inverts the product from serial multiplier 524. This has the effect also of tickling the oscillator, thus assuring that oscillation will be sustained. Output of ones complimenter means 526 passes to summation means 528. Also input to summation means 528 is a feedback term which will be detailed hereinafter. Output of summation means 528 passes to overflow detector means 530 and to overflow limit circuitry and T1 storage means 532. Overflow detect means 530 also receives input from summation means 528. Overflow detector means 530 and overflow limit circuitry delay means 532 are similar to the true sign tree of the digital filter detailed above. Output of the overflow limit circuitry delay and T1 storage means 532 passes to twos complimenter means 534 and to T2 storage means 540. Output from overflow limit circuitry delay and T1 storage means 532 also passes to modulator means 504. The output from overflow limit circuitry delay and T1 storage means 532, after being converted to twos compliment representation by twos complimenter means 534 passes to the input of serial multiplier means 524. Output from twos complimenter means 534 also passes to amplitude detector means 536.

Amplitude detector means 536 compares the amplitude output from overflow limit circuitry delay and T1 storage means 532 to a predetermined amplitude. If the amplitude as determined by amplitude detector means 536 is above the predetermined amplitude, sign control means 538 causes sign insertion means 546 to insert a positive sign in the number input to summation means 548. However, if amplitude detector means 536 determines that the amplitude of the signal is below the predetermined value, sign control means 538 causes sign insertion means 546 to insert a negative sign in the word input to summation means 548. T2 storage means 540 has two outputs, the first output passes to MSB stuff means 542. MSB stuff means 542 determines the stability of the amplitude of the robust digital oscillator means 400. If robust digital oscillator means 400 is oscillating in a relatively stable mode MSB stuff means 542 causes the number 1/512 to be stuffed into the most significant bit by stuff means 544. If, however, MSB stuff means 542 determines the robust digital oscillator means 400 to be relatively unstable in oscillation, stuff means 544 will insert 1/32 into the most significant bits. The appropriate sign is then inserted by sign insertion means 546 and the result is input to summation means 548. The effect of MSB stuff means 542 and stuff means 544 is to maintain the stable oscillation of the robust digital oscillator means 400, if it is oscillating in a stable mode. If, however, oscillations are unstabe, the insertion of 1/32 stuff means 544 will drive the oscillator rapidly towards the desired amplitude. The second output of T2 storage means 540 passes to minus one multiplier means 550 where the output of T2 storage means 540 is multiplied by negative one. This result is input into summation means 548. The result of the summation in summation means 548 will be negative 1 plus or minus the fraction inserted by insertion means 544. Output from summation means 548 is passed to summation means 528 where it is summed with the ones compliment output from serial multiplier means 524. Summation means 548 also outputs to overflow detector means 530.

There are two outputs from robust digital oscillator means 400. One output is from overflow limit circuitry delay and T1 storage means 532. This is a straight digitalized sign wave. It passes to modulator means 504 and is input to twos complimenter means 562. From twos complimenter means 562 the signal passes to serial multiplier means 564 where it is multiplied by the input data to be modulated. The input data is converted to the twos compliment representation by twos complimenter 570. It then passes into multiplier means 564. The output of multiplier means 564 passes to twos complimentor 566 and then to summation means 568. The second output from robust digital oscillator means 400 is the quadrature output. This quadrature output is a sign wave with a 90° phase shift from the first output from robust digital oscillator means 400. The ones complimented output of serial multiplier means 524 passes to divide by two means 552 and thence to summation means 556. Output from times minus ones means 550 passes to delay means 554 and then to summation means 556. The output from summation means 556 passes to a carrier quadrature output tap means 558 and to multiplier means 560. Modulator gain control gating and storage means 572 inputs a selected constant to summation means 574. The constant selected by gain control gating and storage means 572 is controlled by quadrature gain select means 573. In the present embodiment, one of two constants from ROM means 22 is chosen. However, any number of constants could be selected. Carrier gain means 578 is gated into summation means 574 by gating means 576. This allows a small variance in the input constant from gain control gating and storage means 572. Summation means 574 sums these two numbers and outpus them to twos complimenter means 580 from whence they are input to multiplier means 560. The output of multiplier means 560, in the twos compliment representation is input to summation means 568. The output of summation means 568 is the modulated data stream. The output from the MOS/MOD chip is the data stream modulated by the digital sine wave. In the present embodiment this is linked with the digital filter and is there treated as any other sample data. It is to be noted that the frequency of the sign wave output does not have a harmonic or sub-harmonic relation to the sample frequency. It is also to be noted that phase and frequency can be controlled, thus making phase lock loop applications obtainable.

Again, it should be emphasized that while a minimum number of chips is desirable, the configuration of the subject digital filter does not require specifically a three chip functional layout. Accordingly, the functional components as set forth above including multiplier chains, accumulator and logic functions, and coefficient storage and internal counters for timing, can all be incorporated, as required for specific applications, on the most practical number of chips.

It will thus be seen that the object set forth above, among those made apparent from the preceding description are efficiently attained, and since certain changes may be made in carrying out the above method and article without departing from the scope of the invention, it is intended that all matter contained in the above description shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described, what is claimed is:

1. A digital filter means for processing signals input in a digital format; said digitial filter means comprising MOS/LSI accumulator circuitry means having at least one input terminal to receive the digital input signal, at least one MOS/LSI multiplier circuitry means electrically coupled to said accumulator circuitry means, coefficient sequence generator and storage means electrically coupled to said accumulator circuitry means and to said multiplier circuitry means, said accumulator circuitry means comprises a plurality of summation means electrically connected to a pluraltiy of delay means, input gating means electrically connected to first summation means, scalar means electrically connected to said first summation means, second summation means connected to said scalar means, sign/magnitude converter means electrically connected to said first summation means, first delay means connected to said sign/magnitude converter means, first output tap means to multiplier chip connected to said first delay means, second delay means in electrical connection with said first delay means, second output tap means to multiplier circuitry means connected to said second delay means, outputs from multiplier circuitry means are electrically connected to input to a plurality of twos complimenter means, first and second twos complimenter means being electrically connected to third summation means, said third summation means connects to said second summation means, third and fourth twos complimenter means electrically connected to fourth summation means, said fourth summation means electrically connected to first summation means, output means connected to said second summation means.

2. A digital filter means as in claim 1 wherein said accumulator circuitry means further comprises means for determining the true sign of a number at each summation or multiplication; comparing the true sign as determined to the sign which resulted and if required inserting the true sign in the result.

3. A digital filter for processing a digital input signal in cooperation with generator and storage means comprising in combination:
input means;
first, second and third summation means;
first and second delay means;
first, second and third multiplier means connected to the generator and storage means;
means connecting said input means to said first summation means;

means connecting said first summation means to said first delay means and said first multiplier means to provide a first signal multiplied and delayed relative to the input signal;

means connecting said second delay means and said second multiplier means to the output of said first delay means to provide a second signal multiplied and delayed relative to the input signal;

means connecting said third multiplier means to one of the outputs of said first and second delay means providing a third signal multiplied and delayed relative to the input signal;

said third summation means connecting said first and second signals to one of said first and second summation means to provide the sum of said first and second signals;

scaler means connecting the output of said first summation means to said second summation means; and means connecting said third signal to the other of said first and second summation means to provide an output signal comprising the input signal and said first, second and third signals.

4. A digital filter for processing a digital input signal in cooperation with generator and storage means comprising in combination:

input means;
first through fourth summation means;
first and second delay means;
first through fourth multiplier means connected to the generator and storage means;
means connecting said input means to said first summation means;
means connecting said first summation means to said first delay means and said first multiplier means to provide a first signal multiplied and delayed relative to the input signal;
means connecting said second delay means and said second multiplier means to the output of said first delay means to provide a second signal multiplied and delayed relative to the input signal;
means connecting said third and fourth multiplier means to the respective outputs of said first and second delay means providing third and fourth signals multiplied and delayed relative to the input signal;
said third summations means connecting said first and second signals to said first summation means to provide a first summation output from the sum of said first and second signals and the input signal;
scaler means connecting the first summation output to said second summation means; and
said fourth summation means connecting said third and fourth signals to said second summation means to provide an output signal comprising the scaled first summation output added to the sum of said third and fourth signals.

5. A digital device for processing a digital signal in cooperation with generator and storage means comprising in combination:

summation means;
first and second delay means;
first, second and third multiplier means connected to the generator and storage means;
means connecting said summation means to said first delay means and said first multiplier means to provide a first signal multiplied and delayed relative to the input signal thereto.
means connecting said second delay means and said second multiplier means to the output of said first delay means to provide a second signal multiplied and delayed relative to the input signal thereto;
means connecting said third multiplier means to one of the respective outputs of said first and second delay means providing a third signal multiplied and delayed relative to the input signal thereto; and
means connecting said first, second, and third multiplier means to said summation means to provide an output signal comprising the sum of said first, second and third signals.

* * * * *

UNITED STATES PATENT OFFICE
CERTIFICATE OF CORRECTION

Patent No. 4,021,654   Dated May 3, 1977

Inventor(s) Harvey H. Harris

It is certified that error appears in the above-identified patent and that said Letters Patent are hereby corrected as shown below:

Col. 3, Line 50 — After "of" delete "third" and insert therefor --first--; after "means", insert --as scaled by scaler means and the output of third summation means--

Col. 3, line 61   After $Z^{-2}$, insert --Fourth multiplier means multiplies the $\alpha_{2i}$ coefficients from ROM by $Z^{-2}$.--

Col. 3, line 61   "$\alpha_{2i}$" should be --$\alpha_{1i}$--;

"    "    "    "   $Z^{-2}$ should be --$Z^{-1}$--;

Col. 4, line 59   "menas" should be --means--;

Col. 7, line 37   "ccomplimentor" should read --complimentor"

Signed and Sealed this

Twenty-seventh Day of September 1977

[SEAL]

Attest:

RUTH C. MASON
Attesting Officer

LUTRELLE F. PARKER
Acting Commissioner of Patents and Trademarks